US011042027B2

United States Patent
Neophytou et al.

(10) Patent No.: US 11,042,027 B2
(45) Date of Patent: Jun. 22, 2021

(54) NON THERMAL PLASMA SURFACE CLEANER AND METHOD OF USE

(71) Applicant: KING ABDULLAH UNIVERSITY OF SCIENCE AND TECHNOLOGY, Thuwal (SA)

(72) Inventors: Marios Neophytou, Thuwal (SA); Deanna A. Lacoste, Thuwal (SA); Mindaugas Kirkus, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 161 days.

(21) Appl. No.: 16/076,053

(22) PCT Filed: Mar. 6, 2017

(86) PCT No.: PCT/IB2017/051303
§ 371 (c)(1),
(2) Date: Aug. 7, 2018

(87) PCT Pub. No.: WO2017/153898
PCT Pub. Date: Sep. 14, 2017

(65) Prior Publication Data
US 2019/0391387 A1    Dec. 26, 2019

Related U.S. Application Data

(60) Provisional application No. 62/304,482, filed on Mar. 7, 2016.

(51) Int. Cl.
G02B 27/00     (2006.01)
B08B 7/00      (2006.01)
(Continued)

(52) U.S. Cl.
CPC ........ G02B 27/0006 (2013.01); B08B 7/0035 (2013.01); H01J 37/3255 (2013.01);
(Continued)

(58) Field of Classification Search
None
See application file for complete search history.

(56) References Cited

U.S. PATENT DOCUMENTS 6,116,257 A  *  9/2000  Yokota .................. F15B 21/065
                                                         137/1
6,911,593 B2 *  6/2005  Mazumder ................ B60S 1/02
                                                         136/251
(Continued)

FOREIGN PATENT DOCUMENTS

EP         1635123 A1    3/2006

OTHER PUBLICATIONS

Sanaz Ghazi et al., "Dust effect on flat surfaces—A review paper", Renewable and Sustainable Energy Reviews, 2014, pp. 742-751, vol. 33.

(Continued)

*Primary Examiner* — Amy Cohen Johnson
*Assistant Examiner* — Srinivas Sathiraju
(74) *Attorney, Agent, or Firm* — Patent Portfolio Builders PLLC (57) ABSTRACT

Described herein are plasma generation devices and methods of use of the devices. The devices can be used for the cleaning of various surfaces and/or for inhibiting or preventing the accumulation of particulates, such as dust, or moisture on various surfaces. The devices can be used to remove dust and other particulate contaminants from solar panels and windows, or to avoid or minimize condensation on various surfaces. In an embodiment a plasma generation device is provided. The plasma generation device can com-
(Continued)

prise: a pair of electrodes positioned in association with a surface of a dielectric substrate. The pair of electrodes can comprise a first electrode and a second electrode. The first electrode and second electrode can be of different sizes, one of the electrodes being smaller than the other of the electrodes. The first electrode and second electrode can be separated by a distance and electrically connected to a voltage source.

14 Claims, 4 Drawing Sheets

(51) Int. Cl.
  *H01J 37/32* (2006.01)
  *H02S 40/10* (2014.01)
(52) U.S. Cl.
  CPC .. *H01J 37/32073* (2013.01); *H01J 37/32541* (2013.01); *H01J 37/32568* (2013.01); *H02S 40/10* (2014.12)

(56) References Cited

U.S. PATENT DOCUMENTS

| | | | | |
|---|---|---|---|---|
| 7,453,191 | B1* | 11/2008 | Song | H01J 37/32357 313/231.31 |
| 7,543,546 | B2* | 6/2009 | Shibata | H01J 37/32009 118/723 E |
| 7,767,167 | B2* | 8/2010 | Keras | B01D 53/32 422/186.04 |
| 7,969,095 | B2* | 6/2011 | De Vries | H01J 37/32935 315/111.21 |
| 7,999,173 | B1* | 8/2011 | Ashpis | H01L 31/042 136/251 |
| 8,128,884 | B2* | 3/2012 | Min | B01D 53/323 422/186.04 |
| 8,366,871 | B2* | 2/2013 | Kurunczi | H05H 1/24 156/345.43 |
| 9,117,636 | B2* | 8/2015 | Koo | H01J 37/32532 |
| 9,123,845 | B2* | 9/2015 | Ashpis | H02S 40/10 |
| 9,282,623 | B2* | 3/2016 | Roy | H05H 1/2406 |
| 9,381,056 | B2* | 7/2016 | Staack | A61B 18/042 |
| 9,502,202 | B2* | 11/2016 | Arman | H01J 3/02 |
| 9,757,487 | B2* | 9/2017 | Roy | H05H 1/2406 |
| 9,889,218 | B2* | 2/2018 | Morfill | H05H 1/2406 |
| 10,078,068 | B2* | 9/2018 | Brechtel | H01J 49/161 |
| 10,262,836 | B2* | 4/2019 | Chang | H01J 37/32348 |
| 10,286,241 | B2* | 5/2019 | Damazo | A62C 37/50 |
| 10,446,373 | B2* | 10/2019 | Zimmerman | H04L 27/1563 |
| 10,673,539 | B2* | 6/2020 | Ooi | H04B 10/564 |
| 10,690,122 | B2* | 6/2020 | Hu | F24T 10/00 |
| 2004/0055632 | A1* | 3/2004 | Mazumder | H01L 31/02167 136/244 |
| 2006/0056130 | A1* | 3/2006 | Kim | B03C 3/60 361/230 |
| 2009/0200948 | A1* | 8/2009 | Selwyn | H01J 37/32825 315/111.21 |
| 2013/0119264 | A1* | 5/2013 | Yagi | B03C 3/38 250/423 R |
| 2014/0007812 | A1* | 1/2014 | Chang | H01J 37/32577 118/723 E |
| 2018/0140824 | A1* | 5/2018 | Pemen | A61N 1/0472 |
| 2018/0280747 | A1* | 10/2018 | Kwon | A62C 4/00 |
| 2019/0391387 | A1* | 12/2019 | Neophytou | H05H 1/2406 |

OTHER PUBLICATIONS

Travis Sarver et al., "A comprehensive review of the impact of dust on the use of solar energy: History, investigations, results, literature, and mitigation approaches", Reviewable and Sustainable Energy Reviews, 2013, pp. 698-733, vol. 22.
Hoenig, S.A., "Electrostatic Techniques for Protection of Optical Components in Dusty Environments," Applied Optics, Mar. 1, 1980, vol. 19, No. 5, pp. 694-697.
International Search Report in related International Application No. PCT/IB2017/051303, dated Jun. 2, 2017.
Written Opinion of the International Searching Authority in related International Application No. PCT/IB2017/051303, dated Jun. 2, 2017.

* cited by examiner

NON THERMAL PLASMA SURFACE CLEANER AND METHOD OF USE

CROSS-REFERENCE TO RELATED APPLICATION

This application is a U.S. National Stage Application of International Application No. PCT/IB2017/051303, which claims the benefit of and priority to U.S. Provisional Application Ser. No. 62/304,482, having the title "NON THERMAL PLASMA SURFACE CLEANER AND METHODS OF USE," filed on 7 Mar. 2016, the disclosures of which are incorporated herein by reference in their entirety.

BACKGROUND

Dust accumulation, particle deposition due to moisture evaporation, and moisture formation on dielectric surfaces such as windows, tubes, lamps, signboards, solar panels, and imaging sensors is problematic for proper function. Such accumulation is usually removed manually. Further, many dielectric surfaces are often in areas that cannot be readily accessed for cleaning. Thus, there is a need for devices and methods that can adequately clean these surfaces.

SUMMARY

Described herein is a plasma generation device and methods of use of the devices. The methods of use include use of the devices for the cleaning of various surfaces and/or for inhibiting or preventing the accumulation of particulates, such as dust, or moisture on various surfaces. In an aspect, the devices can be used to remove dust and other particulate contaminants from solar panels and windows. The devices can also be used to avoid or minimize condensation on various surfaces. In an embodiment a plasma generation device is provided. The plasma generation device can comprise: a pair of electrodes positioned in association with a surface of a dielectric substrate, wherein: said pair of electrodes comprises a first electrode and a second electrode; said first electrode and second electrode are of different sizes, one of the electrodes being smaller than the other of the electrodes; said first electrode and second electrode are separated by a distance; and said first electrode and second electrode are electrically connected to a voltage source.

In any one or more aspects, the first and second electrodes can be provided with separate alternating current voltage sources, and the voltage source provided to at least one of the electrodes is switched. The first electrode and the second electrode can be comprised of indium tin oxide. A means for canalization of airflow can be included. The electrodes can be positioned on or a distance above the surface of the dielectric substrate. The distance between the first and second electrodes can be about 1 mm to about 10 cm. A rail can be positioned in relation to the surface and at least one of the electrodes positioned in connection with the rail, and a motor affixed directly or indirectly to said electrode, wherein activation of said motor can move said electrode along an axis of said rail. The other electrode of the pair of electrodes can be connected with the rail and activation of the motor can move both of said electrodes along an axis of said rail.

In an embodiment a method of dust removal or removing moisture (e.g., water) is provided. The method can comprise the steps of: providing the plasma generation device of any one or more of the above aspects; and applying a voltage to the electrodes of said plasma generation device. The method can create a plasma or corona discharge. The discharge can create ions. The ions can be accelerated by an electric field in the direction from the smaller electrode towards the larger electrode and past the larger electrode along the surface, thereby creating a flow of wind (or an ionic wind) along the surface.

In an embodiment, a plasma generation kit, is provided. The kit can comprise: a first electrode and a second electrode, wherein said first electrode and second electrodes are different sizes; an AC power supply; a means for electrically connecting said first electrode and said second electrode to said AC power supply; and a means for affixing said first electrode and said second electrode to a dielectric surface.

Other systems, methods, features, and advantages of the present disclosure for a nanowire fabrication device, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

DETAILED DESCRIPTION

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Discussion

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Description

Presented herein are devices and methods of use of the devices for inhibiting or preventing the accumulation of particulates (such as dust) and/or moisture onto various surfaces. In one or more aspects, the devices and methods can be used for removing dust and other particulate contaminants from various surfaces and avoiding, and minimizing, if not preventing, condensation on various surfaces. In a non-limiting example the devices and methods of use remove dust and other particulate contaminants from solar panels.

Solar power is the conversion of sunlight from the sun into electricity. Solar power has a variety of end uses, from powering extraterrestrial reconnaissance crafts (such as satellites, planetary probes, lunar and planetary rovers) to powering terrestrial power grids to powering individual homes to powering small personal electronics (such as calculators) to powering solar/thermal panels and solar cells. In most cases this conversion is done directly by a solar panel that consists of photovoltaic cells arranged in an array. The power output of the solar panel[s] is dependent on the number and surface area of the photovoltaic cell[s] therein, and can be scaled up or down by increasing or decreasing the number of interconnected photovoltaic cells or the number of interconnected solar panels themselves respectively.

Most recently, solar power has become a growing terrestrial alternative energy segment. The costs of solar panels have dropped dramatically over the last two to three decades, which encourages the deployment of solar panels for alternative energy production. While use of solar panels is on the rise, the efficiency of energy conversion by solar panels is one factor preventing widespread adoption of solar energy. Over time, dust and other contaminants can deposit and accumulate on the surface of solar panels drastically reducing their efficiency by 50% or more and ultimately preventing sunlight from reaching the photovoltaic cells.

So far, dust on solar panels is usually removed manually. However, in an area where it is difficult to reach the panels, cleaning is not performed as often as necessary to obtain peak performance. Directed airflow, such as a wind, is one way to remove dust and particulate matter or contaminants from solar panels which are placed in areas not readily accessible for routine maintenance. While a directed air flow can remove particulate matter from the surface, surface charges on the panels and surface charges on the particulate matter or particles can create static or ionic cling between the solar panel surface and dust (or other particulate matter) that cannot be overcome by the force of the airflow. An ionic wind can be used to remove dust and particulate matter to overcome this limitation.

Described herein are non-thermal plasma generation and/or discharge devices and methods of their use. In an aspect the devices can generate an ionic wind that can be used to inhibit accumulation of particulate matter and/or moisture onto surfaces. For example the devices can be used to remove particulate matter, such as dust, from various surfaces, including the surfaces of solar panels.

Figure 1:
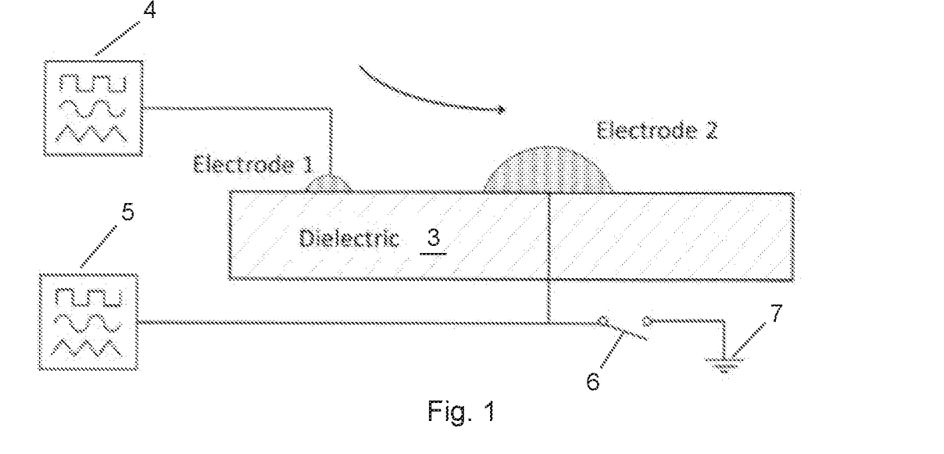
FIG. 1 illustrates plasma generation and ionic wind flow using an embodiment of the present disclosure.

In an aspect, as depicted in FIG. 1, the non-thermal plasma generation and/or discharge device can include a pair of electrodes 1, 2 positioned on or adjacent to a same side of a dielectric substrate 3. Alternatively, the electrode pair can be embedded in the dielectric substrate 3 or in the surface of the substrate 3. The electrodes in the pair of electrodes (electrode 1 and electrode 2) can be of different sizes. For example, they can be of different height and length. The electrodes can be separated by a distance. The space or distance between the electrodes is herein sometimes referred to as the inter-electrode space. The inter-electrode space can vary. For example, the inter-electrode space can be in the range of 1 mm to 10 cm (and any range in between).

In one or more aspects, one electrode, for example depicted as electrode 1 in the figures is smaller than electrode 2. The smaller electrode can have one dimension in the range of 30 nm (nanometer) to 5 mm, and can be as long as necessary, for example like a wire. In various aspects the larger electrode can be at least 2 times larger than the small electrode and can be up to 100 times larger (and any range in between). By larger, the second electrode can be larger in terms of surface area or it can be larger in terms of volume. The length of both electrodes can be similar.

The electrodes can take any one of a number of shapes. In an embodiment the electrodes can have a center or middle portion that is raised or higher than the peripheral edges of the electrodes, thus having a middle or center portion having a greater dimension than the outer or peripheral edges in a perpendicular direction or axis from the surface of the substrate. In an aspect the outer surface of the electrodes can be concave shaped in relation to the surface of the substrate providing a middle or center portion that has a surface that is a greater distance from the substrate surface than the outer or peripheral edges of the electrode, such as illustrated in FIG. 1.

The electrodes 1, 2 can be applied to the substrate 3 or the surface of the substrate 3 in any of a number of ways. For example, the electrodes can be printed, painted, slot-die coated, blade or spray coated, affixed by adhesive or vacuum deposited (e.g., E-beam lithography, sputtering, and/or thermal evaporation) on the dielectric surface and can have different sizes and geometries.

The electrodes 1, 2 can be made of any material that is electrically conductive or serves as an electrical conductor. The electrodes 1, 2 can be optically transparent or opaque and can include optically transparent materials such as indium-doped tin oxide (ITO), fluorine-doped tin oxide (FTO), and poly(3,4-ethylenedioxythiophene) polystyrene sulfonate (PEDOT:PSS) The electrodes 1, 2 can be formed of any type (nanoparticles, nanowires, nanoflakes, etc.) of electrically conductive elements (e.g., Ag, Cu, W, Cr) and/or alloys (e.g., Cu:Ag) and/or pristine and doped oxides (e.g., ITO, FTO, AZO, ZnO) and/or sulfides (AgS, $Fe_{1-x}S$). The electrodes 1, 2 can be printed onto the substrate from an ink formulation. The ink formulation can be any organic and inorganic compound in any ink formulation type. Examples of suitable ink formulations include nanoparticles and/or nanoflakes and/or nanowires and/or other elemental complexes including or incorporating the conductive elements, oxides or sulfides. The electrodes can have a thickness between 30 nm-10 mm (and any range in between). The thickness can be measured in a vertical dimension perpendicular to the substrate.

The electrodes 1, 2 can be deposited on any dielectric substrate/superstrate. In one or more aspects the substrate/superstrate can be a rigid dielectric material. For example, the substrate/superstrate can be formed from glass, sapphire, quartz and/or mica. In one or more aspects, the substrate/superstrate can be formed of a flexible material. Suitable flexible materials include but not limited to polyimides (e.g., KAPTON), polyethylene terephthalates (PET), polyurethanes (PU), polyethylene naphthalates (PEN) (e.g., Teonex), and/or polycarbonates (e.g., LEXAN).

The electrodes can be deposited on either or both surfaces of the substrate/superstrate (asymmetrically) in order to create Dielectric Barrier Discharge (DBD) actuators and/or on the same side of the surface in order to create non-thermal plasma surface discharges, such as corona discharges. Our various plasma generating devices can generate an ionic wind. An ionic wind is defined herein as a flow of gas surrounding the electrodes by ion collision with neutral particles.

The electrodes can be connected to any power supply (including, for example, an AC/DC high voltage source). The alternating current (AC) source can be any commercial or custom made AC power supply and can provide any shape of AC voltage for example (sine, square, triangle, etc.). The AC voltage can have a peak to peak voltage in the range of 100V to 50 kV. The AC voltage can have a frequency of 1 Hz to 1 MHz (mega Hertz). In any one or more aspects the peak to peak range, the voltage range and/or the frequency range can be any range or value within these ranges. In one or more aspects an alternating current source 4 can be provided for electrode 1 and a separate alternating current source 5 can be provided in connection with electrode 2, as depicted in FIG. 1. The current source 5 for electrode 2 can include a switch 6. The current source for electrode 2 can include a ground 7. In one or more aspects the same power source can be provided and used to power both electrodes 1, 2.

Upon voltage application to the electrodes 1, 2 of the device, a weak plasma, or corona discharge, can be created close or closest to the smaller electrode in the electrode pair and between the pair of electrodes within the inter-electrode space. The switch can allow control of the connection to the ground of the system (for example solar panel). That means the device can work with a floating potential, or between the ground and high voltages. This can be of interest for application to electrical systems, such as solar panels. The plasma discharge can be non-thermal (i.e., does not heat the dielectric surface) and may or may not be luminous. Positive and negative ions can be created by the plasma. The ions can be accelerated by an electric field in the direction from the smaller electrode towards the larger electrode of the pair of electrodes and past the larger electrode away from the pair of electrodes. During transit or flow, ions collide with neutral molecules and/or atoms and generate a flow of wind called ionic wind.

The ionic wind flow can inhibit accumulation onto and/or remove particulates (such as dust or other contaminants) from a surface, such as a dielectric surface. Additionally, ion agglomerates present on the surface in the inter-electrode space can charge particles which can be accelerated and removed from the surface. The device may not produce vibrations and can be used for vibration-sensitive applications such as optical laser techniques.

Plasma generation on the dielectric surface upon voltage application to the device can alter the hydrophilicity or hydrophobicity of the surface. In the increased hydrophilicity case air humidity in the inter-electrode space can prevent formation of droplets (such as water droplets) or other moisture on the surface but spread evenly forming a "liquid coating" along the surface and can be repelled from the surface. The repelled humidity can drag dust or other particulate matter without leaving any stains or spots. In the case of increased hydrophobicity, our device can along the surface provide a dehumidification method in addition to another method for dust removal similar to self cleaning glass.

In an embodiment, a device of the present disclosure can be affixed to the dielectric surface of a solar panel (see, e.g., FIG. 1). The device can generate a non-thermal plasma which in turn can create an ionic wind. The non-thermal plasma generated by the device does not heat the underlying substrate or surface of the solar panel. The device can be comprised of a pair of electrodes. The pair of electrodes can be affixed to the solar panel surface and electrically connected or coupled to a voltage source. The same power source can be applied to both electrodes, or separate power sources can be used one for powering each electrode. The pair of electrodes can be affixed to the same side of the solar panel. The electrodes of the electrode pair can be affixed to the surface by a suitable means, such as: printing, painting, slot-die coating, blade or spray coating, affixed by adhesive, or vacuum depositing, E-beam lithography, sputtering, and thermal evaporation. Alternatively, one or more of the electrodes in the pair can be embedded in the solar panel. The electrodes in the electrode pair have different sizes, where one electrode is smaller in size than the other electrode of the pair of electrodes, and the electrodes can be separated by an inter-electrode space. The electrodes in the electrode pair can be made of any material that is an electrical conductor, including transparent materials such as indium-doped tin oxide (ITO). The electrodes in the electrode pair can be of any suitable geometry. One skilled in the art will be able to recognize a suitable electrode material, size, geometry, and affixation method.

Upon application of a voltage to the electrodes by the AC source, a weak plasma, called a corona discharge, can be created close to the smaller electrode of the electrode pair and towards and past the larger electrode of the electrode pair and away from the pair of electrodes. The plasma may or may not be luminous, but in any event can be non-thermal. Positive and/or negative ions can be created in the plasma. The ions can be accelerated by the electric field in the direction of the larger electrode of the electrode pair. The accelerated ions can collide with neutral molecules and/or atoms and can generate a flow of gas, an ionic wind. The ionic wind can remove particulates from the dielectric surface of the solar panel. The ions can agglomerate on the surface of the particulates present in the inter electrode space, and additionally charge small particles nearby. Once electrically charged, the particulates can be accelerated by the electric field and removed from the solar panel surface.

Figure 3:
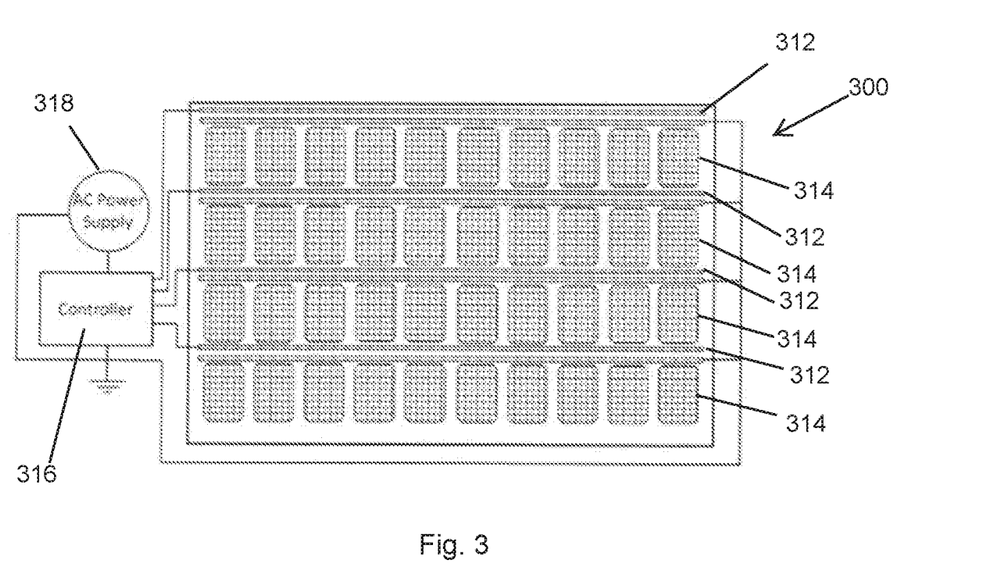
FIG. 3 illustrates sequence synchronization of AC voltage supplied to plasma generation devices in an array in accordance with another embodiment of the present disclosure.

One skilled in the art will appreciate the need to choose and optimize parameters described herein according to environmental conditions and desired effect, such as (but not limited to): size and material of the electrodes, the distances between two electrodes of a pair, the frequency and amplitude of the AC voltage, the geometry and number of electrode pairs in an array, and the dielectric material (see for example FIG. 3). The distance between two pairs of electrodes in an array should be larger than the inter-electrode space between a pair of electrodes. The pairs of electrodes can be parallel, as depicted in FIG. 3, or concentric. A single AC power source can be used for all the electrode pairs, or separate power sources can be provided to power arrays separately from each other or even electrodes within a pair of electrodes separately from each other. A controller can be provided to allow sequencing of the applied voltage. Alternatively, each pair of electrodes can be powered by a different voltage source. Further, the plasma generation device can be supplied as a kit and affixed to existing dielectric surfaces.

Figure 2:
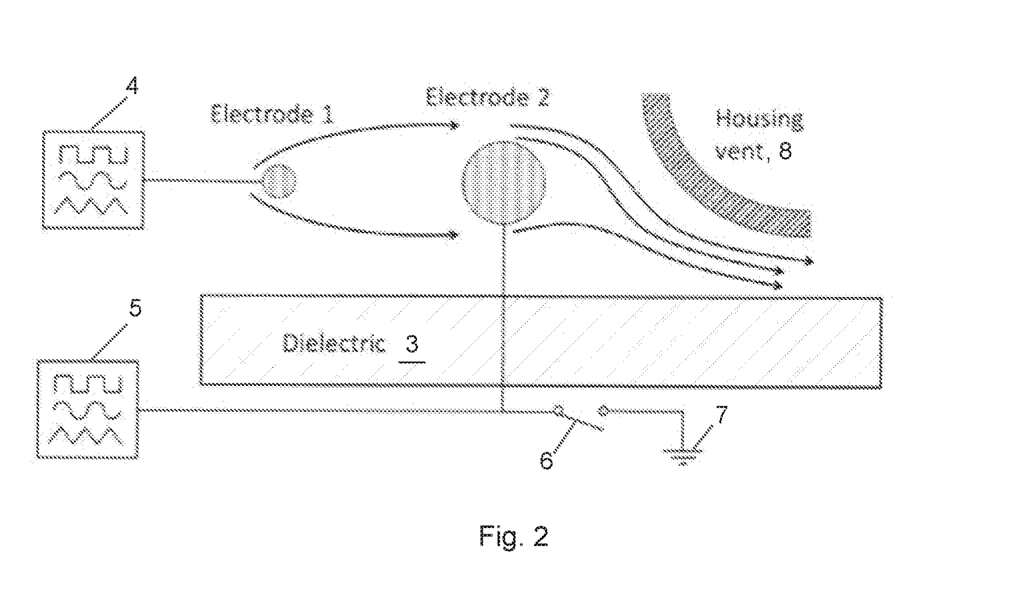
FIG. 2 illustrates a further embodiment of the present disclosure in which a pair of electrodes are positioned in association with a dielectric surface above a surface.

If the zone of influence of a single pair of electrodes 1, 2 needs to be expanded, the electrodes can be spaced apart from, but still in association with, a surface of the substrate 3. For example, the electrodes 1, 2 can be positioned from 1 mm up to 10 cm (and any range there between) above the surface of the substrate 3, as shown in FIG. 2. The electrodes 1, 2 can then be surrounded by gas and the gas flow or ionic wind generated by the device can be faster and with a higher flow rate than when the electrodes are affixed on or in the surface of the substrate 3. The flow produced by the ionic wind can also be canalized with the help of, for example, a housing vent 8. The geometry of the electrodes can be varied, as long as the typical size of electrode 1 remains smaller than electrode 2.

In one or more aspects the system can be placed on one or more rails and moved along the surface to be cleaned with the help of a motor, such as a step motor actuator. In order to increase the power output of a solar panel, an array of photovoltaic cells can be created and cells added to the array to increase the surface area and power output of the solar panel. Increasing the surface area of a solar panel or other dielectric surface can create a need to scale up the plasma generation device accordingly to cover the surface area of the dielectric surface area. In order to treat large surface areas, the electrodes can be organized or positioned in association with the substrate. For example as illustrated in FIG. 3 pairs of the electrodes can be placed in an array. The plurality of the pairs of electrodes can be electrically connected to an AC power supply (for example, a high-voltage AC power supply) and further connected to a controller that can synchronize the voltage application between the AC power supply and plurality of electrode pairs. In this instance of an array application of the AC voltage can be sequenced in a synchronized manner in order to optimize the removal of dust or other contaminants.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Example 1

On a dielectric flat surface (polymethylmethacrylate), that can be described following two directions, X and Y, two parallel stainless steel electrodes of 5 cm length in the X direction were affixed. The small electrode had a thickness (in the Z direction, perpendicular to the dielectric surface) of 0.85 mm, and the big electrode had a thickness of 2.5 mm (in the Z direction). The inter-electrode gap distance, in the Y direction, was 20 mm. The two electrodes were connected to a high-voltage power supply, and we applied AC voltage (a sine signal), at a repetition rate of 100 Hz, with a peak-to-peak voltage of 6 kV. An ionic wind was generated, parallel to the surface, with a velocity of 1.5 m/s along and generally parallel to the dielectric surface, measured 20 mm behind the big electrode, by a mechanical anemometer.

Example 2

As another example, voltage application to the plasma discharge device can make the underlying dielectric surface more hydrophobic, repelling water. Water droplets can be forced off of the surface in this manner. The droplets can encapsulate particulate matter and remove particulate matter from the surface. Moisture in the atmosphere in the inter-electrode space can also be repelled. Voltage application to the device can be constitutive, meaning the device is always on, which can prevent deposition of moisture and particulates on the surface.

Example 3

As another example, the electrodes of the plasma generation device can be positioned in association with and above the surface of the dielectric substrate, as described above (see, FIG. 2). In this example, the electrodes can then surrounded by gas upon application of a voltage from an AC voltage power supply and the gas flow generated by the device can be faster than when the electrodes are affixed to or in the substrate surface. The voltage applied to the device can be 10 kV and the frequency can be 10 Hz.

Example 4

In an example, a means for canalization of the ionic wind can be coupled (such as a vent or baffle, see e.g. FIG. 2) to the present device or positioned in association with the device. This addition can cause the ionic wind generated by the plasma to be canalized, meaning the wind can be directed into a pre-designed set path with a means such as a vent or duct.

Example 5

As depicted in FIG. 3, the electrodes of the plasma generation device can be affixed into a system 300 including one or more rails 312 positioned about a plurality of devices, such as solar cells 314, to be cleaned (of dust humidity, etc.) and coupled (mechanically or otherwise) to motive means, such as one or more step actuator motors (not shown). Activation of the motive means (motor(s)) can move the electrodes along the one or more rails 312, and can maintain a distance between the electrodes and an inter-electrode space therein. A controller 316 is provided for controlling the motive means and/or actuating the electrodes. The controller can be any conventionally available motive controller. The controller 316 can be coupled to a power supply 318.

Example 6

In a further example, the device of the present disclosure can be used for the cleaning of surfaces for visualization devices, and housings of visualization devices, such as CCTV cameras, safety cameras, or optical sensors. For example, the electrodes can be printed directly on the glass surface of the lens of the camera, or alternatively on the protective covering of the housing of the camera. The surfaces can be any mineral glass as well as organic glass material. These surfaces can be flat or parabolic, or spherical, or any shape. The electrodes can be transparent, or not, as long as they can allow efficient cleaning of the visualization surface, without altering the field of view. The applied voltage can be either DC or AC, with a frequency in the range of 10 to 10 000 Hz.

Figure 4:
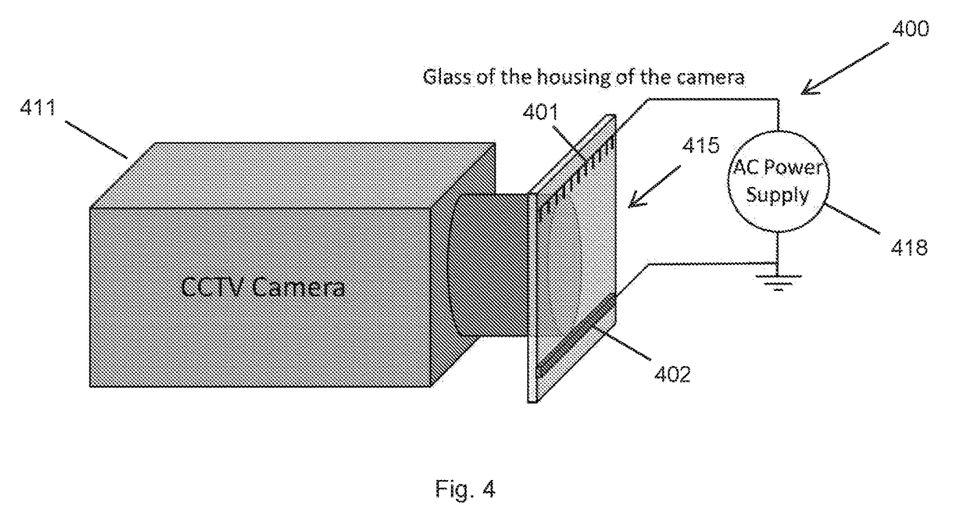
FIG. 4 illustrates use of an embodiment of the present disclosure for cleaning the field of view of a CCTV camera with a flat housing.

FIG. 4 presents an example of use of a device 400 for cleaning the field of view of a CCTV camera 411 with a flat housing 415. One pair of electrodes 401, 402 can be printed on the protective glass of the CCTV camera 411, spaced by a distance of about 10 mm. The large electrode 402 is a line of 2 mm large and 0.1 mm thickness, connected to the ground, while the second electrode 401 consists of an array of parallel lines of 2 mm length, 0.5 mm large and 0.1 mm thickness, spaced by 2 mm, and connected together and to an AC high voltage power supply 418. The frequency of the applied high voltage can be 1 kHz, and the maximum amplitude of the voltage can be 15 kV.

Figure 5:
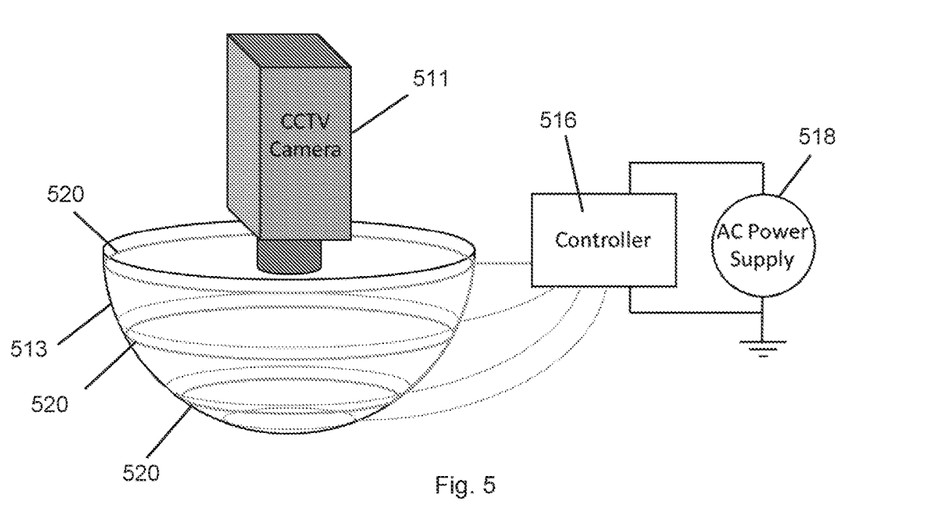
FIG. 5 illustrates an example of an embodiment of the present disclosure installed for use on a spherical surface of the housing of a CCTV camera.
Figure 6:
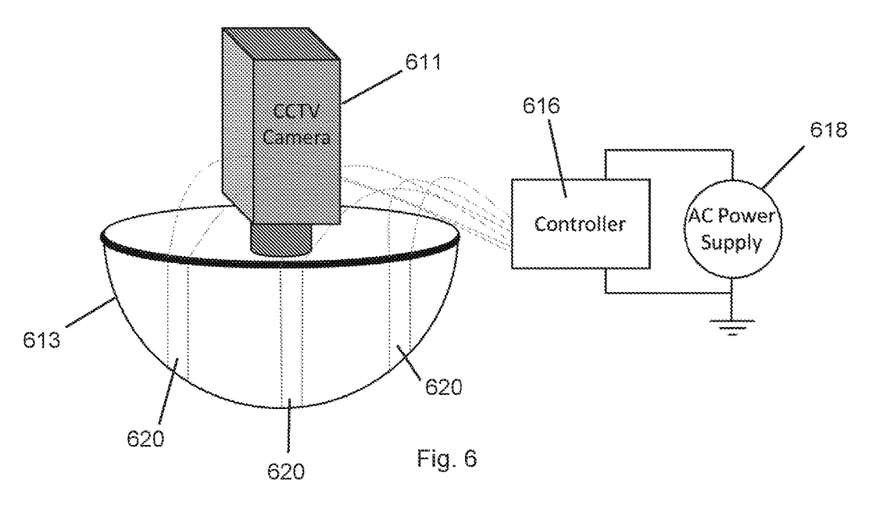
FIG. 6 illustrates another example of an embodiment of the present disclosure installed for use on a spherical surface of the housing of a CCTV camera.

FIGS. 5 and 6 present an example of the present device installed on the spherical surface 513, 613 of the housing of a CCTV camera 511, 611. Three pairs of transparent electrodes 520, 620 are printed on the spherical surface and arranged such as they allow cleaning of the entire surface of the field of view by generating ionic wind at the proximity of the surface, removing dust accumulation and organic material such as spider webs. The high voltage can be applied in sequence between each pair of electrodes by a power supply 518, 618. The applied voltage can be DC or AC, with a frequency in the range 10 Hz to 10 kHz. The applied voltage can be in the range of 500 V to 20 kV.

Example 7

Figure 7:
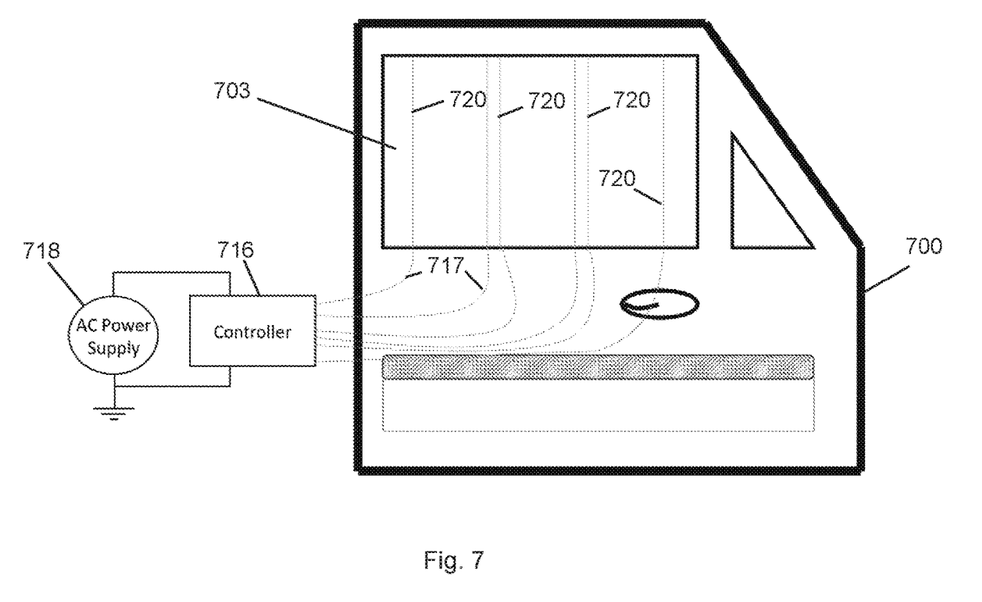
FIG. 7 illustrates use of an embodiment of the present disclosure for cleaning the glass of a vehicle.

In another example, the device can be used for cleaning the front and/or back windshields as well as the door windows of a vehicle. The electrodes 720 can be printed either directly on a side of the glass 703 or under a thin transparent flexible coating material. The electrodes can be printed from transparent or non-transparent materials as long as they do not affect the visualization of the driver and the passengers. The electrical circuitry 717 can either be placed inside of the door chassis or close to the electrical circuitry of the vehicle.

The electrode configuration on the interior side of the door 700 window 703 presented in FIG. 7 can be applied on the interior glass surface of the vehicles to remove the organic particles such as fingerprints or the dust accumulated. Based on the purpose of the application, ionic wind or plasma is generated between the electrodes by applying a DC or AC voltage in the range of 100 V to 20 kV with the frequency range of 10 Hz to 10 kHz. The car battery or an external power supply can be used to generate the power with the desired specifications. The cleaning procedure can be applied either on a programmed schedule by controller 716 connected to a power supply 718 such as after the driver and the passengers get out of the vehicle or on demand of the user.

Example 8

As another example, the electrodes of the present plasma generation device can be positioned on any type of display (e.g., liquid crystal display (LCD), thin-film-transistor liquid crystal display (TFT-LCD), light emitting diode display (LED), plasma display (PDP), any touchscreen, tablet or any device with an integrated display of any type. Due to generation of plasma during operation of the plasma generation device it can be used for removing dirt, dust, oils, fingerprints, germs and other contaminants from the touchscreens of automated teller machines (ATM) and a wide range devices with an integrated display of any type and any shape. The combination of the plasma generation device with a heating unit of any type can be used as a de-dusting, germs removing and de-icing device for cleaning of the displays of ATMs. The plasma generation device can be also positioned on biometric scanner of any design and shape.

Example 9

As another example, the electrodes of the plasma generation device can be positioned on any type of manned or unmanned aeronautical vehicle, such as an airplane. The operation of such a device can prevent dirt, dust, oil and ice formation on the plane.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations, Many variations and modifications may be made to the above-described embodiments without departing from the principles of the present disclosure. All such modifications and variations are intended to be included herein within the scope of this disclosure and protected by the following claims.

We claim:
1. A plasma generation device comprising:
   a pair of electrodes positioned in association with a surface of a dielectric substrate, wherein
      the pair of electrodes comprises a first electrode and a second electrode, the first electrode and second electrode are of different sizes, one electrode of the pair of electrodes is smaller than the other of the pair of electrodes, the first electrode and second electrode are separated by a distance, the first electrode and second electrode are electrically connected to a voltage source, application of voltage from the voltage source generates a non-thermal plasma discharge, and the pair of electrodes is formed directly on a same surface of the dielectric substrate;

a rail positioned in relation to a surface to be cleaned, wherein at least one of the pair of electrodes is positioned in connection with the rail; and a motor affixed directly or indirectly to the at least one of the pair of electrodes and configured to move the at least one of the pair of electrodes along an axis of the rail.

2. The plasma generation device of claim 1, wherein the voltage source comprises first and second alternating current voltage sources, which are respectively electrically connected to the first and the second electrodes, and the first or second alternating current voltage sources that is connected to a larger one of the pair of electrodes is switched.

3. The plasma generation device of claim 1, wherein the first electrode and the second electrode are comprised of indium tin oxide.

4. The plasma generation device of claim 1, further comprising:

a vent or hood configured to canalization airflow.

5. The plasma generation device of claim 1, wherein the first and second electrodes are transparent.

6. The plasma generation device of claim 1, wherein both of the pair of electrodes are connected with the rail and activation of the motor moves both electrodes of the pair of electrodes along the axis of the rail.

7. The plasma generation device of claim 1, wherein the dielectric substrate is a camera lens, an optical sensor, a window, or part of a solar cell.

8. A plasma generation kit, comprising:

an alternating current (AC) power supply;

a first electrode and a second electrode, wherein the first electrode and second electrodes are different sizes and are connected to the AC power supply, wherein application of voltage from the AC power supply generates a non-thermal plasma discharge;

an adhesive on the first and second electrodes, wherein the adhesive is configured to attaching the first and second electrodes directly to a same surface of a dielectric substrate;

a rail to be positioned in relation to a surface to be cleaned, wherein at least one of the pair of electrodes is positioned in connection with the rail; and a motor configured to be affixed directly or indirectly to the at least one of the pair of electrodes and configured to move the at least one of the pair of electrodes along an axis of the rail.

9. The plasma generation kit of claim 8, wherein the first electrode and the second electrode are comprised of indium tin oxide.

10. The plasma generation kit of claim 8, further comprising:

a vent or hood configured to canalize airflow in proximity of the dielectric substrate.

11. The plasma generation kit of claim 8, wherein the first and second electrodes are transparent.

12. The plasma generating kit of claim 8, wherein the first and second electrodes are concave shaped relative to a surface of the dielectric substrate.

13. A plasma generation device comprising:

a pair of electrodes positioned in association with a surface of a dielectric substrate, wherein the pair of electrodes comprises a first electrode and a second electrode, the first electrode and second electrode are of different sizes, one electrode of the pair of electrodes is smaller than the other of the pair of electrodes, the first electrode and second electrode are separated by a distance, the first electrode and second electrode are electrically connected to a voltage source, application of voltage from the voltage source generates a non-thermal plasma discharge, and the pair of electrodes are positioned at a non-zero distance above the surface of the dielectric substrate, wherein the distance above the surface is 1 mm to 10 cm.

14. The plasma generation device of claim 13, wherein the first and second electrodes are arranged on different sides of the dielectric substrate.

* * * * *